(12) United States Patent
Kameda et al.

(10) Patent No.: US 9,130,483 B2
(45) Date of Patent: Sep. 8, 2015

(54) PIEZOELECTRIC POWER GENERATOR

(71) Applicant: MURATA MANUFACTURING CO., LTD., Nagaokakyo-Shi, Kyoto-fu (JP)

(72) Inventors: Eitaro Kameda, Nagaokakyo (JP); Chikahiro Horiguchi, Nagaokakyo (JP); Katsumi Fujimoto, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 549 days.

(21) Appl. No.: 13/726,701

(22) Filed: Dec. 26, 2012

(65) Prior Publication Data

US 2013/0181578 A1 Jul. 18, 2013

Related U.S. Application Data

(63) Continuation of application No. PCT/JP2011/063205, filed on Jun. 9, 2011.

(30) Foreign Application Priority Data

Jul. 2, 2010 (JP) ................................. 2010-151634

(51) Int. Cl.
*H02N 2/18* (2006.01)
*B60C 23/04* (2006.01)
*H01L 41/113* (2006.01)

(52) U.S. Cl.
CPC .............. *H02N 2/18* (2013.01); *B60C 23/0411* (2013.01); *H01L 41/1134* (2013.01)

(58) Field of Classification Search
CPC ..... H01L 41/0926; H01L 41/39; H01L 57/00; H02N 2/18; F23Q 3/002
USPC .................. 310/330, 331, 332, 339
See application file for complete search history.

(56) References Cited

U.S. PATENT DOCUMENTS

2011/0012479 A1* 1/2011 Nakamura et al. ............ 310/339
2011/0148255 A1* 6/2011 Nihei ............................ 310/330
2011/0148256 A1* 6/2011 Fujimoto ...................... 310/339
2011/0227456 A1* 9/2011 Horiguchi ..................... 310/339

FOREIGN PATENT DOCUMENTS

| JP | 2005-312269 A | 11/2005 |
|---|---|---|
| JP | 2006-318838 A | 11/2006 |
| JP | 2008-054450 | 3/2008 |
| WO | WO-2010-029715 A1 | 3/2010 |
| WO | WO-2010-067620 A1 | 6/2010 |

OTHER PUBLICATIONS

PCT/JP2011/063205 Written Opinion dated Sep. 13, 2011.
PCT/JP2011/063205 International Search Report dated Sep. 13, 2011.

* cited by examiner

*Primary Examiner* — Derek Rosenau
*Assistant Examiner* — Bryan Gordon
(74) *Attorney, Agent, or Firm* — Arent Fox LLP

(57) ABSTRACT

A piezoelectric power generator that includes a first elastic body, which deforms along a first direction x upon receiving a stress, and a piezoelectric power-generating element. A second elastic body is arranged on a y1 side of the first elastic body and a piezoelectric element is fixed to a y1-side surface of the second elastic body. When the first elastic body bends into a shape that is concave toward the y1 side, the second elastic body receives a stress from the first elastic body. When the first elastic body bends into a shape that is convex toward the y1 side, the second elastic body does not receive a stress from the first elastic body. The piezoelectric power generator further includes a vibration suppressing member that is arranged between the first elastic body and the second elastic body and suppresses bending mode vibration of the second elastic body.

14 Claims, 9 Drawing Sheets

PIEZOELECTRIC POWER GENERATOR

CROSS REFERENCE TO RELATED APPLICATIONS

The present application is a continuation of International application No. PCT/JP2011/063205, filed Jun. 9, 2011, which claims priority to Japanese Patent Application No. 2010-151634, filed Jul. 2, 2010, the entire contents of each of which are incorporated herein by reference.

FIELD OF THE INVENTION

The present invention relates to piezoelectric power generators. In particular, the present invention relates to piezoelectric power generators that include a piezoelectric power-generating element.

BACKGROUND OF THE INVENTION

In the related art, known examples of systems that detect the air pressure of for example the tires of an automobile include a tire air pressure monitoring system (Tire Pressure Monitoring System: TPMS). In general, a TPMS is attached to the inside of a tire and includes a sensor that detects the air pressure and temperature of the tire and a transmitter that wirelessly transmits data to a transceiver arranged in the vehicle. Accordingly, in a TPMS, it is necessary that there be a power source for supplying power to the sensor and the transmitter, for example.

In the related art, a variety of power generators have been proposed as power sources that can be used in TPMS's and the like. Among these generators, piezoelectric power generators that utilize the piezoelectric effect have particularly been the focus of attention, since this kind of generator can be easily reduced in size.

For example, the piezoelectric power generator illustrated in FIG. 18 is described in below-cited Patent Document 1. As illustrated in FIG. 18, a piezoelectric power generator 100 includes an elastic body 102. One end portion of the elastic body 102 is fixed in place and a weight 101 is attached to the other end portion of the elastic body 102. Contacts 103 and 104 are provided on main surfaces 102a and 102b of the elastic body 102. In addition, piezoelectric elements 105 and 106 are fixed above the main surfaces 102a and 102b.

In the piezoelectric power generator 100, when the elastic body 102 is displaced in the upward direction due to application of a stress to the weight 101, the contact 103 applies a pressure to the piezoelectric element 105. As a result, the piezoelectric element 105 is deformed and power is generated in the piezoelectric element 105. In addition, when the elastic body 102 is displaced in the downward direction due to a stress being applied to the weight 101, the contact 104 applies a pressure to the piezoelectric element 106. As a result, the piezoelectric element 106 is deformed and power is generated in the piezoelectric element 106.

Patent Document 1: Japanese Unexamined Patent Application Publication No. 2005-312269

SUMMARY OF THE INVENTION

In the piezoelectric power generator 100 illustrated in FIG. 18, when the piezoelectric elements 105 and 106 are deformed due to being subject to a pressure by the contacts 103 and 104, a tensile stress is applied to piezoelectric bodies 105a and 106a of the piezoelectric elements 105 and 106. Here, the piezoelectric bodies 105a and 106a are susceptible to tensile stress and are liable to be damaged when subject to a tensile stress. Therefore, it has been difficult to realize high durability for the piezoelectric power generator 100.

The present invention has been made in light of the above-described problem and an object thereof is to provide a piezoelectric power generator that has excellent durability.

A piezoelectric power generator according to the present invention includes a first elastic body and a piezoelectric power-generating element. The first elastic body deforms along a first direction upon receiving a stress. The piezoelectric power-generating element includes a second elastic body and a piezoelectric element. The second elastic body is arranged on one side in a second direction, which is orthogonal to the first direction, with respect to the first elastic body. The piezoelectric element is fixed to a surface of the second elastic body on the one side in the second direction. The piezoelectric power generator according to the present invention is structured such that, when the first elastic body bends into a shape that is concave toward the one side in the second direction, the second elastic body receives a stress from the first elastic body and bends into a shape that is concave toward the one side in the second direction, whereas when the first elastic body bends into a shape that is convex toward the one side in the second direction, the second elastic body does not receive a stress from the first elastic body. The piezoelectric power generator according to the present invention further includes a vibration suppressing member. The vibration suppressing member is at least partially arranged between the first elastic body and the second elastic body. The vibration suppressing member suppresses bending mode vibration of the second elastic body.

In the present invention, the term "elastic body" refers to a member that elastically deforms when subject to a stress, and specifically for example refers to a member that is formed of a rubber, a metal or a plastic.

In a certain specific aspect of the piezoelectric power generator according to the present invention, the vibration suppressing member includes a stopper that is fixed to the first elastic body and abuts against a part of the second elastic body on the opposite side to the first elastic body in the second direction.

In another specific aspect of the piezoelectric power generator according to the present invention, a Young's modulus of the vibration suppressing member is smaller than Young's moduli of the first and second elastic bodies and a loss coefficient of the vibration suppressing member is larger than loss coefficients of the first and second elastic bodies.

In another specific aspect of the piezoelectric power generator according to the present invention, the vibration suppressing member is formed of a spring.

In yet another specific aspect of the piezoelectric power generator according to the present invention, the vibration suppressing member is arranged between the first elastic body and the second elastic body in the second direction. With this configuration, transmission of vibration of the first elastic body to the second elastic body can be more effectively suppressed. Therefore, the occurrence of fatigue fractures in the piezoelectric element can be more effectively suppressed. As a result, more excellent durability can be obtained.

In yet another specific aspect of the piezoelectric power generator according to the present invention, the first elastic body includes an elastic body main body, a first abutting portion and a second abutting portion. The elastic body main body is positioned on another side in the second direction with respect to the second elastic body. The first abutting portion is fixed to the elastic body main body. The first abutting portion is positioned on one side in the first direction with respect to the second elastic body. The second abutting portion is fixed to the elastic body main body. The second abutting portion is positioned on another side in the first direction with respect to the second elastic body. The first and second abutting portions are provided so as to abut against the second elastic body when the elastic body main body takes a shape that is concave toward the one side in the second direction.

In yet another specific aspect of the piezoelectric power generator according to the present invention, at least a portion of the second elastic body except for an end portion of the second elastic body on the one side in the first direction is fixed to the first elastic body.

In yet another specific aspect of the piezoelectric power generator according to the present invention, the piezoelectric power generator further includes a fixing member. The fixing member fixes at least a portion of the second elastic body except for an end portion of the second elastic body on the one side in the first direction, and the first elastic body to each other. The fixing member is formed of the vibration suppressing member.

In yet another specific aspect of the piezoelectric power generator according to the present invention, the first elastic body includes an elastic body main body, a first abutting portion and a second abutting portion. The elastic body main body is positioned on another side in the second direction with respect to the second elastic body. The first abutting portion is fixed to the elastic body main body. The first abutting portion is positioned on one side in the first direction with respect to the second elastic body. The second abutting portion is fixed to the elastic body main body. The second abutting portion is positioned on another side in the first direction with respect to the second elastic body. The first and second abutting portions are provided so as to abut against the second elastic body when the elastic body main body takes a shape that is concave toward the one side in the second direction. The piezoelectric power generator according to the present invention further includes a first connection member and a second connection member. The first connection member connects the first abutting portion and the second elastic body to each other. The second connection member connects the second abutting portion and the second elastic body to each other. Each of the first and second connection members are formed of the vibration suppressing member.

In yet another specific aspect of the piezoelectric power generator according to the present invention, the first elastic body and the second elastic body are joined to each other via the vibration suppressing member.

In the present invention, a vibration suppressing member is provided that is arranged between the first elastic body and the second elastic body and that suppresses bending mode vibration of the second elastic body. Therefore, the occurrence of fatigue fractures in the piezoelectric element caused by application of vibration can be suppressed. Thus, excellent durability can be obtained.

DETAILED DESCRIPTION OF THE PREFERRED EMBODIMENTS

Hereafter, examples of preferred embodiments and modifications of the present invention will be described. However, the embodiments and modifications described below are merely illustrative. The present invention is in no way limited to the below-described embodiments and modifications.

First Embodiment

In this embodiment, description will be given of a case in which a piezoelectric power generator is arranged inside a tire and is used in a TPMS. However, applications of piezoelectric power generators of the present invention are not limited to only TPMS's. A piezoelectric power generator of the present invention can be applied to any application including a TPMS. A piezoelectric power generator of the present invention can be also used in applications such as ID tags and IC cards.

Figure 1:
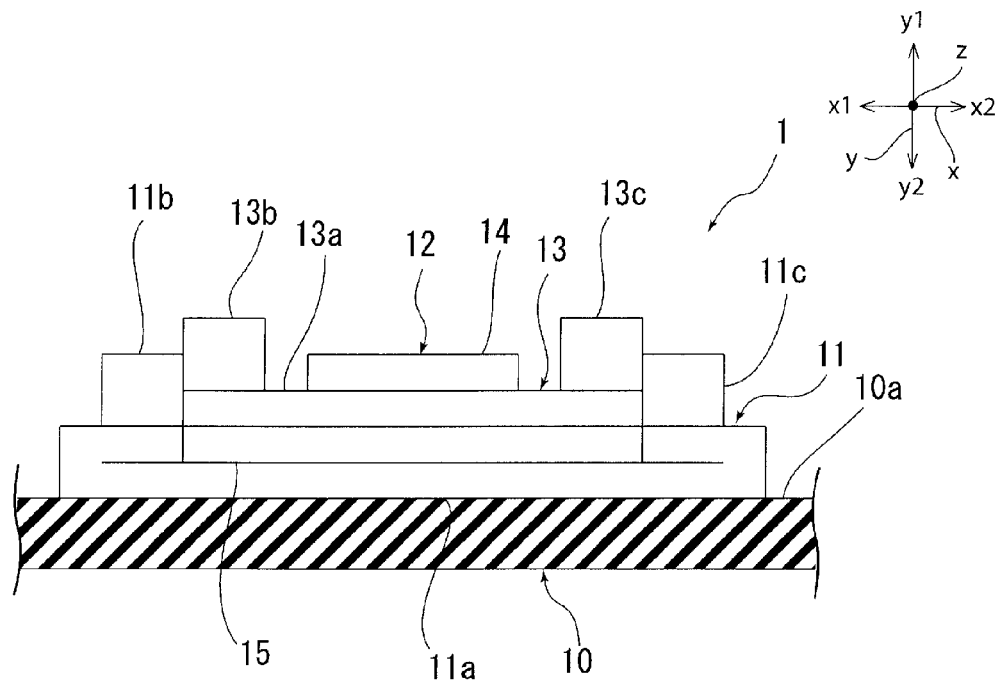
FIG. 1 is a schematic side view of a piezoelectric power generator according to a first embodiment.
Figure 2:
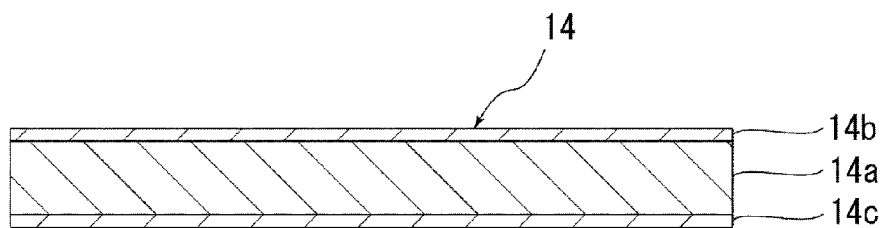
FIG. 2 is a schematic sectional view of a piezoelectric element.
Figure 3:
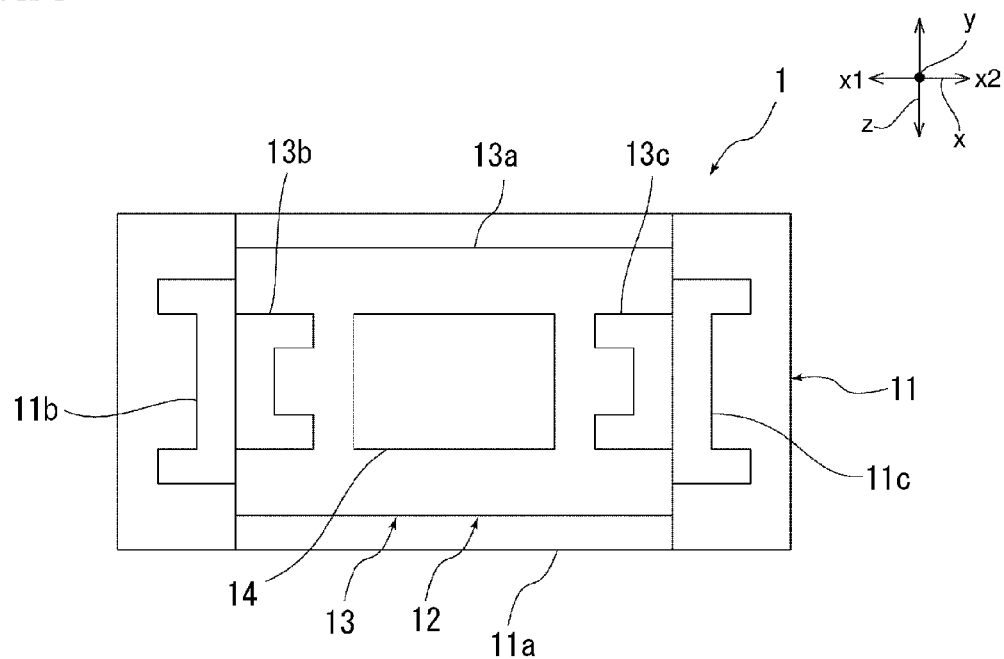
FIG. 3 is a schematic plan view of the piezoelectric power generator according to the first embodiment.

FIG. 1 is a schematic side view of a piezoelectric power generator according to a first embodiment. FIG. 2 is a schematic sectional view of a piezoelectric element. FIG. 3 is a schematic plan view of the piezoelectric power generator according to the first embodiment.

As illustrated in FIG. 1, the piezoelectric power generator 1 of this embodiment is attached to an inner wall 10a of a rubber tire 10. The piezoelectric power generator 1 includes a first elastic body 11. When the tire 10 rotates and is deformed as a result of coming into contact with the ground, the first elastic body 11 receives a stress from the tire 10 and is deformed along a first direction x, which is parallel to a circumferential direction of the tire 10.

The first elastic body 11 is not particularly limited as long as it is body that is capable of elastically deforming. The first elastic body 11, for example, can be formed of a metal such as iron or aluminum, an alloy including iron or aluminum, or a resin.

The first elastic body 11 includes a plate-shaped elastic body main body 11a and first and second abutting portions 11b and 11c. In this embodiment, the elastic body main body 11a and the first and second abutting portions 11b and 11c are formed of a single folded elastic plate.

The elastic body main body 11a is fixed to the inner wall 10a of the tire 10. The method of fixing the elastic body main body 11a is not particularly limited. The elastic body main body 11a can be for example fixed using an adhesive, a pressure-sensitive adhesive, a screw, via fitting or with a belt. Consequently, the elastic body main body 11a is deformed with deformation of the tire 10. Specifically, the elastic body main body 11a bends into a shape that is convex or a concave toward a y1 side in a second direction y (direction perpendicular to elastic body main body 11a), which is orthogonal to the first direction x, together with deformation of the tire 10.

The first abutting portion 11b is fixed to the elastic body main body 11a. The first abutting portion 11b is positioned on an x1 side of the elastic body main body 11a in the first direction x. The first abutting portion 11b is formed so as to extend from the elastic body main body 11a toward the y1 side in the second direction y. The first abutting portion 11b opposes the second elastic body 13, which will be described below, in the first direction x.

The second abutting portion 11c is fixed to the elastic body main body 11a. The second abutting portion 11c is positioned on an x2 side of the elastic body main body 11a in the first direction x. The second abutting portion 11c is formed so as to extend from the elastic body main body 11a toward the y1 side in the second direction y. The second abutting portion 11c opposes the second elastic body 13, which will be described below, in the first direction x.

In this embodiment, an example will be described in which the first elastic body 11 is provided as a separate body to the tire 10, but the first elastic body 11 may be formed of part of the tire 10.

A piezoelectric power-generating element 12 is arranged on the y1 side in the second direction y with respect to the elastic body main body 11a of the first elastic body 11. The piezoelectric power-generating element 12 is a unimorph-structure piezoelectric power-generating element that includes the second elastic body 13 and a piezoelectric element 14.

The second elastic body 13 is arranged on the y1 side in the second direction y with respect to the elastic body main body 11a of the first elastic body 11. In this embodiment, the second elastic body 13 is not directly fixed to the first elastic body 11. The second elastic body 13 can be displaced in the second direction y with respect to the first elastic body 11. The second elastic body 13 is positioned between the first abutting portion 11b and the second abutting portion 11c in the first direction x.

The second elastic body 13 includes a plate-shaped elastic body main body 13a and first and second abutting portions 13b and 13c. In this embodiment, the plate-shaped elastic body main body 13a and the first and second abutting portions 13b and 13c are formed of a single folded elastic plate. The elastic body main body 13a is arranged so as to be parallel with the elastic body main body 11a.

The first abutting portion 13b is fixed to an x1-side end portion of the elastic body main body 13a in the first direction x. The first abutting portion 13b is formed so as to extend from the elastic body main body 13a toward the y1 side in the second direction y. The first abutting portion 13b is positioned on the x2 side in the first direction x with respect to the first abutting portion 11b and opposes the first abutting portion 11b in the first direction x.

The second abutting portion 13c is fixed to an x2-side end portion of the elastic body main body 13a in the first direction x. The second abutting portion 13c is formed so as to extend from the elastic body main body 13a toward the y1 side in the second direction y. The second abutting portion 13c is positioned on the x1 side in the first direction x with respect to the second abutting portion 11c and opposes the second abutting portion 11c in the first direction x.

The second elastic body 13 is also not particularly limited so long as it is a body that is capable of elastically deforming, similarly to the first elastic body 11. The second elastic body 13 can be formed of, for example, a metal such as iron or aluminum, an alloy including iron or aluminum, or a resin.

As illustrated in FIGS. 1 and 3, the piezoelectric element 14 is fixed to a y1-side surface of the elastic body main body 13a of the second elastic body 13 in the second direction y. The method of fixing the piezoelectric element 14 is not particularly limited. The piezoelectric element 14 may be adhered or pressure-sensitively adhered to the elastic body main body 13a or may be fixed to the elastic body main body 13a through for example solder, a bolt or a screw.

As illustrated in FIG. 2, the piezoelectric element 14 includes a piezoelectric substrate 14a and first and second electrodes 14b and 14c. The first and second electrodes 14b and 14c sandwich the piezoelectric substrate 14a therebetween. Power generated in the piezoelectric substrate 14a is extracted from the first and second electrodes 14b and 14c.

The piezoelectric substrate 14a is composed of a suitable piezoelectric material. Specific examples of such a piezoelectric material include PZT, $LiTaO_3$, $LiNbO_3$, quartz and organic piezoelectric bodies. The polarization direction of the piezoelectric substrate 14a is not particularly limited. The piezoelectric substrate 14a, for example, may be polarized along the second direction y, the first direction x or a third direction z.

The first and second electrodes 14b and 14c can be formed of a suitable conductive material. The first and second electrodes 14b and 14c, for example, can be formed of a metal such as iron, copper, aluminum, silver, gold or chromium, or an alloy such as stainless steel, duralumin, nichrome, monel, cupro or ITO.

However, in the present invention, the piezoelectric element is not limited to the piezoelectric element 14 of this embodiment. In the present invention, the piezoelectric element may be a piezoelectric element that includes a plurality of piezoelectric substrates. In addition, the first and second electrodes may be formed of a single conductive film or may be formed of a laminate of a plurality of conductive films.

In this embodiment, as illustrated in FIG. 1, the elastic body main body 11a of the first elastic body 11 and the elastic body main body 13a of the second elastic body 13 are arranged with a space therebetween in the second direction y. A vibration suppressing member 15 is arranged between the elastic body main body 11a and the elastic body main body 13a in the second direction y. The elastic body main body 11a and the elastic body main body 13a are joined to each other via the vibration suppressing member 15. However, the elastic body main bodies 11a and 13a and the vibration suppressing member 15 may be capable of being displaced relative to each other in the second direction y and not joined to each other.

The vibration suppressing member 15 is a member that suppresses bending mode vibration of the second elastic body 13. In more detail, the vibration suppressing member 15 has a function of suppressing bending mode vibration of the second elastic body 13 by suppressing transmission of vibration of the first elastic body 11 to the second elastic body 13, and has a function of suppressing bending vibration of the second elastic body 13 generated by transmission of an external force such as one due to a collision or a change in acceleration. Consequently, in the case where the vibration suppressing member 15 exists between the first and second elastic bodies 11 and 13, it is less likely that transmission of vibration of the first elastic body 11 to the second elastic body 13 will occur than in the case where the first elastic body 11 and the second elastic body 13 are directly fixed to each other (at one portion or at a plurality of portions).

The vibration suppressing member 15 is not particularly limited so long as it is a member that has a function of impeding the transmission of vibration as described above. The vibration suppressing member 15 can be formed of a viscous body having viscosity or may be formed of an viscoelastic body having both viscosity and elasticity. Specifically, the vibration suppressing member 15 can be for example formed of an elastic body having a smaller Young's modulus than the first and second elastic bodies 11 and 13 and having a larger loss coefficient than the first and second elastic bodies 11 and 13. In addition, the vibration suppressing member 15 may be formed of a flat spring or a coil spring. That is, the vibration suppressing member 15 may be a member that is composed of a material having a vibration transmission impeding function that suppresses transmission of vibration or may be a member having a structure that exhibits a vibration transmission impeding function. In other words, the vibration suppressing member 15 may be a member that, through the material it is composed of, realizes a vibration transmission impeding function or may be a member that, through its structure, realizes a vibration transmission impeding function.

Figure 4:
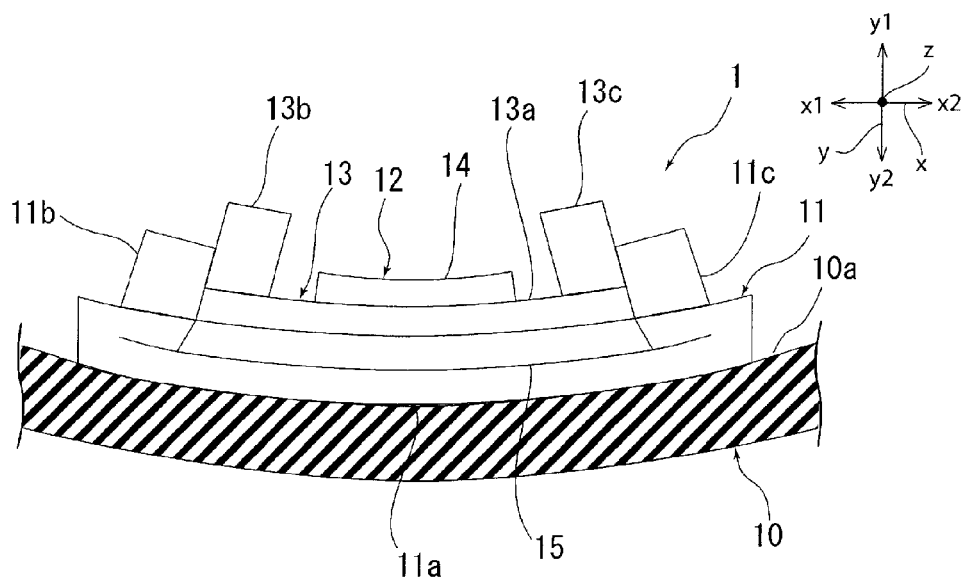
FIG. 4 is a schematic side view of the piezoelectric power generator of the first embodiment when a stress is applied to the piezoelectric power generator and the first elastic body is deformed into a shape that is concave toward a y1 side in a second direction y.

FIG. 4 is a schematic side view of the piezoelectric power generator of the first embodiment when a stress is applied to the piezoelectric power generator and the first elastic body deforms into a shape that is concave toward the y1 side in the second direction y.

Next, description will be given of a power generation of the piezoelectric power generator 1 of this embodiment while mainly referring to FIG. 1 and FIG. 4.

As illustrated in FIG. 1, the piezoelectric power generator 1 is constructed such that when a part of the inner wall 10a of the tire 10 to which the piezoelectric power generator 1 is attached is in contact with the ground and this portion has a flat shape and the elastic body main bodies 11a and 13a of the first and second elastic bodies 11 and 13 have a flat shape, a stress is not generated between the first abutting portions 11b and 13b and between the second abutting portions 11c and 13c.

On the other hand, as illustrated in FIG. 4, when the part of the inner wall 10a of the tire 10 to which the piezoelectric power generator 1 is attached is not in contact with the ground and has a curved shape, the first elastic body 11 takes a shape that is concave toward the y1 side in the second direction y and the distance between the first and second abutting portions 11b and 11c in the first direction x becomes shorter. Consequently, the first and second abutting portions 11b and 11c abut against the first and second abutting portions 13b and 13c of the second elastic body 13 and the first and second abutting portions 13b and 13c of the second elastic body 13 are pressed. Along with this, the elastic body main body 13a is also deformed into a shape that is concave toward the y1 side in the second direction y. As a result, a compressive stress is applied to the piezoelectric substrate 14a (refer to FIG. 2) of the piezoelectric element 14 fixed to the surface of the elastic body main body 13a on the y1 side in the second direction y.

Therefore, when the tire 10 rotates, the piezoelectric power generator 1 alternately enters the state illustrated in FIG. 1 and the state illustrated in FIG. 4. Thus, a compressive stress is intermittently applied to the piezoelectric substrate 14a. As a result, electricity is generated in the piezoelectric substrate 14a and generation of electrical power is performed.

Figure 5:
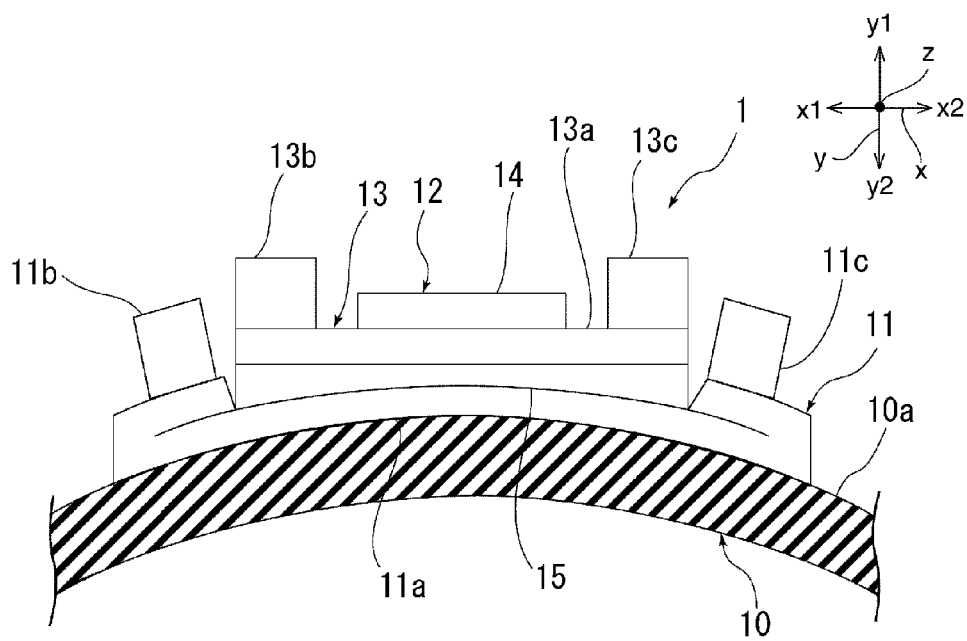
FIG. 5 is a schematic side view of the piezoelectric power generator of the first embodiment when a stress is applied to the piezoelectric power generator and the first elastic body is deformed into a shape that is convex toward the y1 side in the second direction y.

FIG. 5 is a schematic side view of the piezoelectric power generator of the first embodiment when a stress is applied to the piezoelectric power generator and the first elastic body deforms into a shape that is convex toward the y1 side in the second direction y.

When the tire 10 is rotating along a flat piece of ground, the piezoelectric power generator 1 alternately enters the state illustrated in FIG. 1 and the state illustrated in FIG. 4 as described above. Consequently, a compressive stress is applied to the piezoelectric substrate 14a, and a tensile stress, which would be liable to damage the piezoelectric substrate 14a, is not applied to the piezoelectric substrate 14a.

For example, in the case where the tire 10 advances over a protrusion on the ground such as when there is a stone on the ground, the first elastic body 11 could take a shape that is convex toward the y1 side in the second direction y as illustrated in FIG. 5. In this case, if, along with the first elastic body 11, the second elastic body 13 were to also take a shape that is convex toward the y1 side in the second direction y, a tensile stress would be applied to the piezoelectric substrate 14a and it would become likely that fatigue fractures would occur in the piezoelectric substrate 14a.

In contrast to this, in this embodiment, the second elastic body 13 is not directly joined to the first elastic body 11, but rather is joined to the first elastic body 11 via the vibration suppressing member 15 which is capable of elastically deforming. Consequently, when the first elastic body 11 takes a shape that is convex toward the y1 in the second direction y, the second elastic body 13 substantially does not receive a stress from the first elastic body 11. Therefore, as illustrated in FIG. 5, also in the case where the first elastic body 11 takes a shape that is convex toward the y1 side in the second direction y, the second elastic body 13 is not likely to take a shape that is convex toward the y1 side in the second direction y. Therefore, it is not likely that a tensile stress will be applied to the piezoelectric substrate 14a. Therefore, it is not likely that the piezoelectric substrate 14a will experience a fatigue fracture. As a result, excellent durability can be realized. From the viewpoint of more effectively suppressing application of a tensile stress to the piezoelectric substrate 14a, the vibration suppressing member 15 is preferably a member that is more easily elastically deformed than the first and second elastic bodies 11 and 13.

Figure 6:
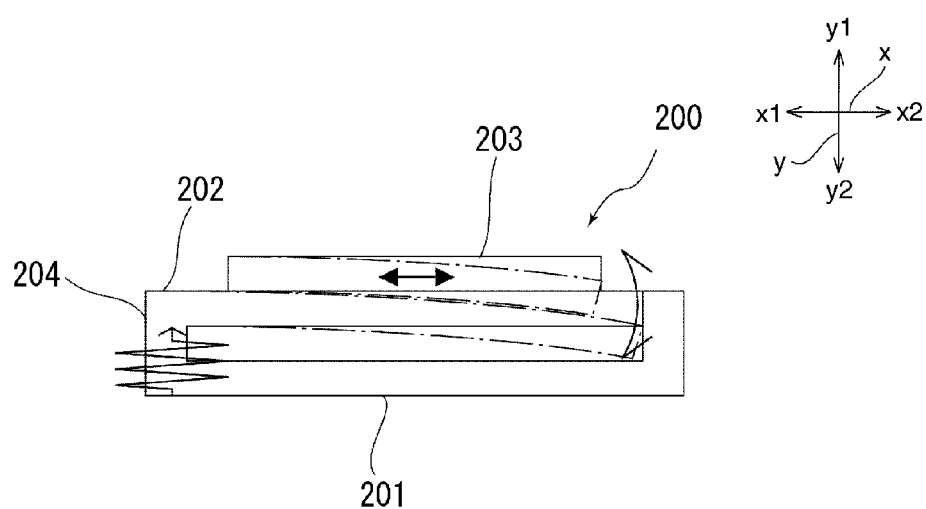
FIG. 6 is a schematic side view of a piezoelectric power generator according to a comparative example.

FIG. 6 is a schematic side view of a piezoelectric power generator according to a comparative example. As illustrated in FIG. 6, a piezoelectric power generator 200 includes a first elastic body 201, a second elastic body 202 and a connection portion 204. The first elastic body 201, the second elastic body 202 and the connection portion 204 are formed of a single folded elastic plate. An x1-side end portion of the second elastic body 202 in the first direction x is connected to the first elastic body 201 via the connection portion 204. On the other hand, an x2-side end portion of the second elastic body 202 in the first direction x is capable of being displaced relative to the first elastic body 201. A piezoelectric element 203 is fixed to a surface of the second elastic body 202 on the opposite side to the first elastic body 201.

Also in this piezoelectric power generator 200, compressive stress is applied to the piezoelectric element 203 and tensile stress is not applied to the piezoelectric element 203 at the time of power generation. In addition, also in the case where the first elastic body 201 takes a shape that is convex toward the y1 side in the second direction y, the second elastic body 202 does not take a shape that is convex toward the y1 side in the second direction y. Consequently, tensile stress is not applied to the piezoelectric element 203.

However, in the piezoelectric power generator 200, the first elastic body 201 and the second elastic body 202 are connected to each other via the connection portion 204 and the space between the first elastic body 201 and the second elastic body 202 is hollow. Consequently, if vibration of the first elastic body 201 is transmitted to the second elastic body 202 via the connection portion 204, the second elastic body 202 vibrates and is displaced toward the y2 side in the second direction y. As a result, a tensile stress is applied to the piezoelectric substrate of the piezoelectric element 203 fixed to the top of the second elastic body 202. Therefore, it is likely that fatigue fractures will occur in the piezoelectric substrate.

In contrast, in this embodiment, as illustrated in FIG. 1, the vibration suppressing member 15 is arranged between the first elastic body 11 and the second elastic body 13. Consequently, vibration of the first elastic body 11 is not likely to be transmitted to the second elastic body 13. Therefore, it is not likely that the second elastic body 13 will vibrate and a tensile stress will be applied to the piezoelectric substrate 14a of the piezoelectric element 14. Therefore, it is not likely that fatigue fractures will occur in the piezoelectric substrate 14a.

Figure 7:
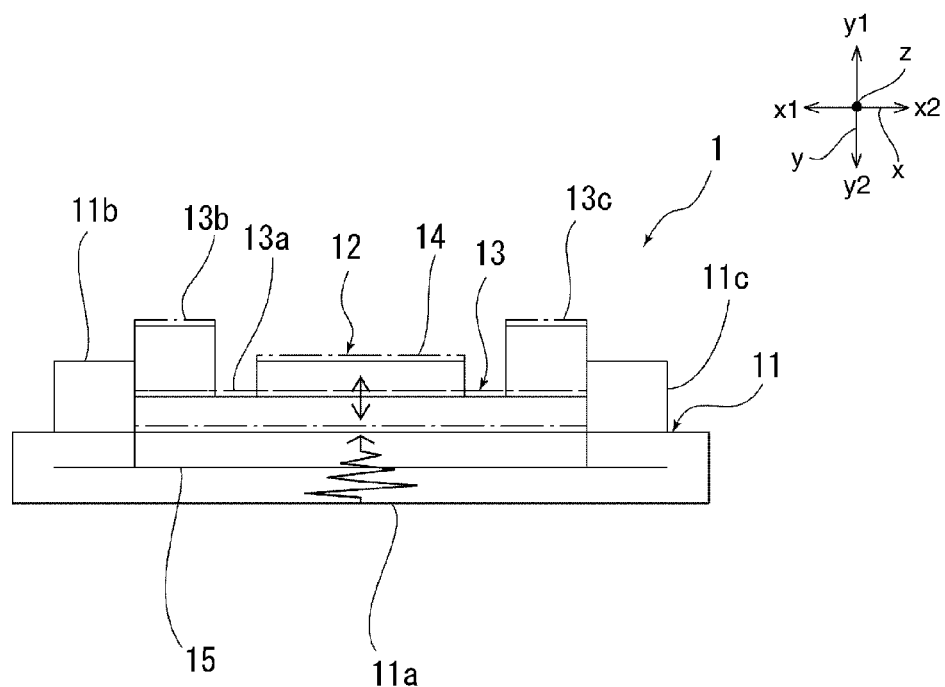
FIG. 7 is a schematic side view of the piezoelectric power generator of the first embodiment when a vibration is applied to the first elastic body of the piezoelectric power generator along the second direction y.

Furthermore, in this embodiment, different to as in the piezoelectric power generator 200, the second elastic body 13 is not directly fixed to the first elastic body 11. Consequently, even if a vibration is transmitted to the second elastic body 13, as illustrated in FIG. 7, it is not likely that the second elastic body 13 will vibrate as a whole along the second direction y and it is not likely that the second elastic body 13 will be deformed. Therefore, it is less likely that a tensile stress will be applied to the piezoelectric substrate 14a.

In addition, the vibration suppressing member 15 is arranged between the first elastic body 11 and the second elastic body 13 in the second direction y and the space between the first elastic body 11 and the second elastic body 13 in the second direction y is solid. Therefore, greater displacement of a portion of the second elastic body 13 toward the y2 side in the second direction y than other portions of the second elastic body 13 is more effectively suppressed. Therefore, a tensile stress is less likely to be applied to the piezoelectric substrate 14a.

Thus, in the piezoelectric power generator 1 of this embodiment, at the time of power generation, it unlikely that a tensile stress will be applied to the piezoelectric substrate 14a either when the first elastic body 11 takes a shape that is convex toward the y1 side in the second direction y or when vibration is generated in the first elastic body 11. Therefore, excellent durability is realized for the piezoelectric power generator 1.

Hereafter, other example embodiments and modifications of the present invention will be described. In the following description, components having substantially the same functions as those of the first embodiment are referred to using the same symbols and description thereof is omitted.

First and Second Modifications

Figure 8:
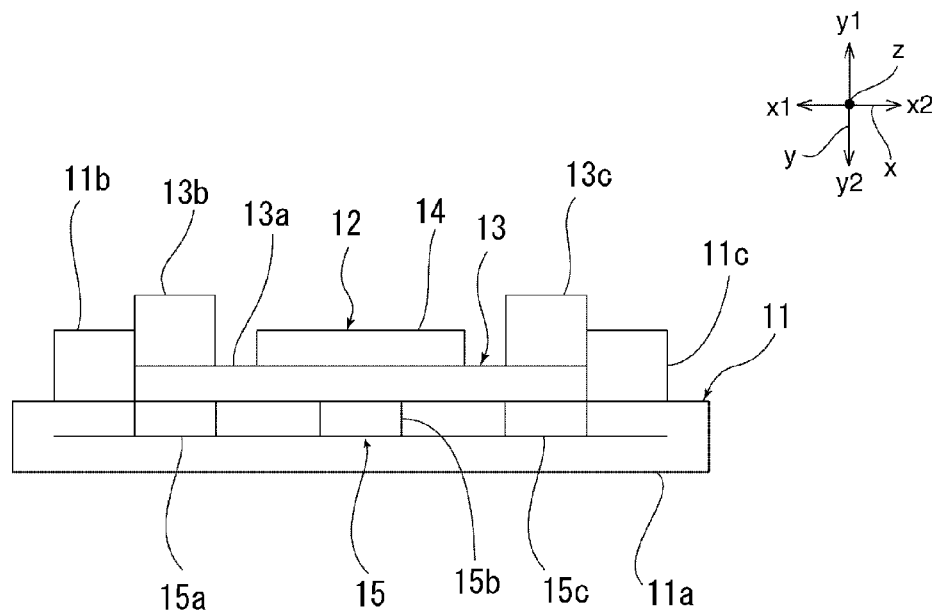
FIG. 8 is a schematic side view of a piezoelectric power generator according to a first modification.
Figure 9:
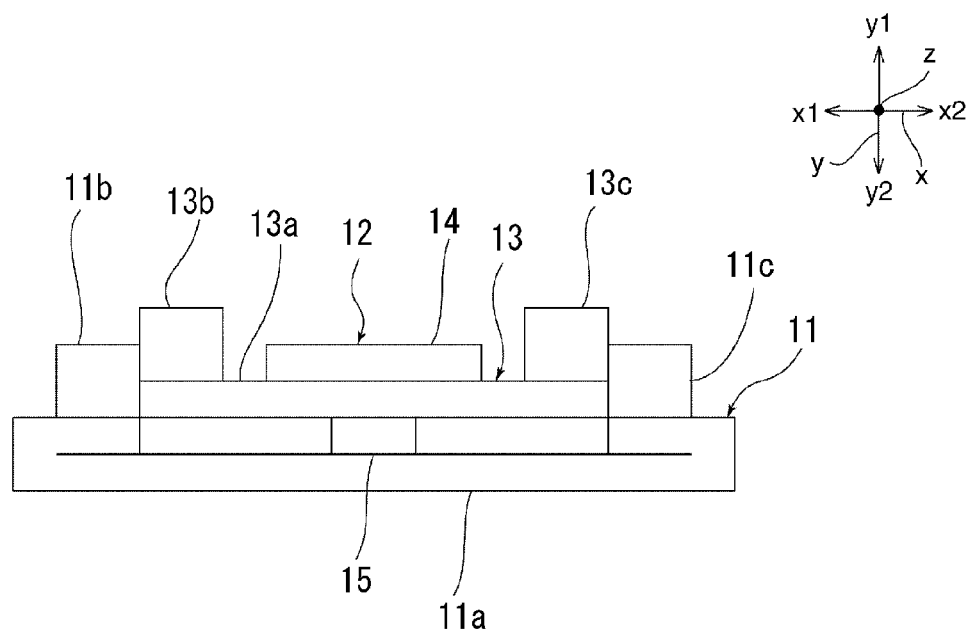
FIG. 9 is a schematic side view of a piezoelectric power generator according to a second modification.

FIG. 8 is a schematic side view of a piezoelectric power generator according to a first modification. FIG. 9 is a schematic side view of a piezoelectric power generator according to a second modification.

The first and second modifications are modifications of the first embodiment. In the first embodiment, a case was described in which the vibration suppressing member 15 is provided over the entirety of a part in which the first elastic body 11 and the second elastic body 13 oppose each other in the second direction y. However, the present invention is not limited to this configuration.

For example, as illustrated in FIG. 8 and FIG. 9, the vibration suppressing member 15 may be arranged in portion of a part in which the first elastic body 11 and the second elastic body 13 oppose each other in the second direction y. Specifically, in the example illustrated in FIG. 8, a plurality of vibration suppressing members 15 (first to third vibration suppressing members 15a to 15c) are arranged at constant intervals in portions of a part in which the first elastic body 11 and the second elastic body 13 oppose each other in the second direction y.

In the example illustrated in FIG. 9, a single vibration suppressing member 15 is arranged in a part in the center in the first direction x of the part in which the first elastic body 11 and the second elastic body 13 oppose each other in the second direction y. A similar effect to as in the first embodiment is obtained in these cases.

Second Embodiment

Figure 10:
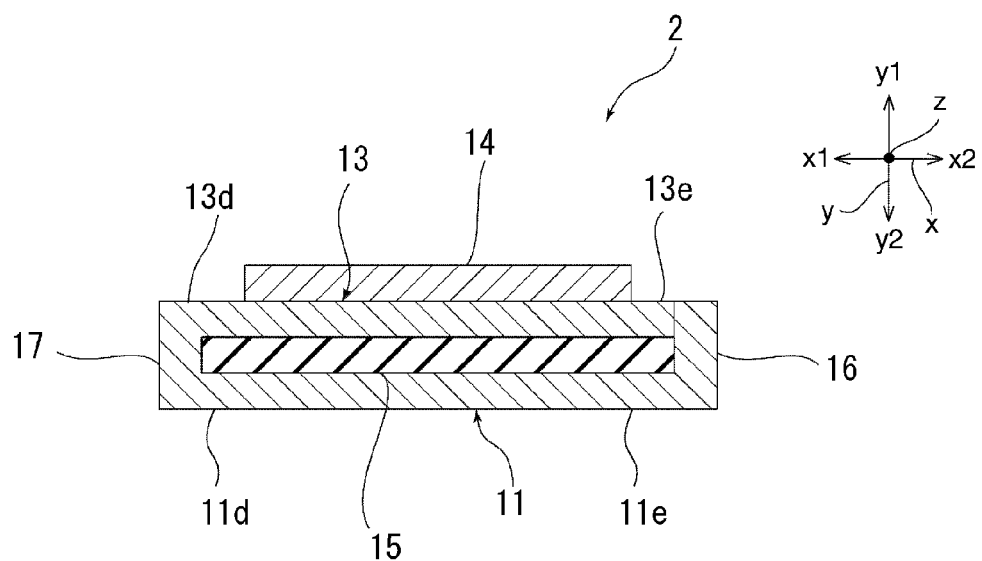
FIG. 10 is a schematic sectional view of a piezoelectric power generator according to a second embodiment.

FIG. 10 is a schematic sectional view of a piezoelectric power generator according to a second embodiment.

In a piezoelectric power generator 2 of this embodiment, each of the first and second elastic bodies 11 and 13 are formed in a plate-like shape. An x1-side end portion 11d of the first elastic body 11 in the first direction x and an x1-side end portion 13d of the second elastic body 13 in the first direction x are connected to each other by a connection portion 17. An x2-side end portion 11e of the first elastic body 11 in the first direction x and an x2-side end portion 13e of the second elastic body 13 in the first direction x are not directly joined to each other. An abutting portion 16 is connected to the x2-side end portion 11e of the first elastic body 11 in the first direction x. The end portion 13e of the second elastic body 13 abuts against the abutting portion 16. Consequently, also in the piezoelectric power generator 2 of this embodiment, similarly to as in the piezoelectric power generator 1 of the first embodiment, when the first elastic body 11 takes a shape that is concave toward the y1 side in the second direction y, the second elastic body 13 also takes a shape that is concave toward the y1 side in the second direction y, but when the first elastic body 11 takes a shape that is convex toward the y1 side in the second direction y, substantially no stress is applied to the second elastic body 13 and the second elastic body 13 does not take a shape that is convex toward the y1 side in the second direction y. Therefore, also in the piezoelectric power generator 2 of this embodiment, the application of tensile stress to the piezoelectric substrate 14a at the time of power generation is effectively suppressed.

In addition, similarly to as in the piezoelectric power generator 1 of the first embodiment, the vibration suppressing member 15 is arranged between the first elastic body 11 and the second elastic body 13 and therefore vibration of the first elastic body 11 is not likely to be transmitted to the second elastic body 13. Therefore, even in the case where the first elastic body 11 vibrates, application of a tensile stress to the piezoelectric substrate 14a is effectively suppressed.

However, in the case of this embodiment, the second elastic body 13 is connected to the first elastic body 11 via the connection portion 17. Consequently, compared to the piezoelectric power generator 1 of the first embodiment, vibration of the first elastic body 11 is more easily transmitted to the second elastic body 13. However, even if a vibration is transmitted to the second elastic body 13, vibration of the second elastic body 13 is effectively attenuated by the vibration suppressing member 15. Consequently, repeated application of a tensile stress to the piezoelectric substrate 14a is suppressed.

Therefore, also in the piezoelectric power generator 2 of this embodiment, excellent durability is realized similarly to as in the piezoelectric power generator 1 of the first embodiment.

In this embodiment, the vibration suppressing member 15 may or may not be joined to the second elastic body 13.

Third Modification

Figure 11:
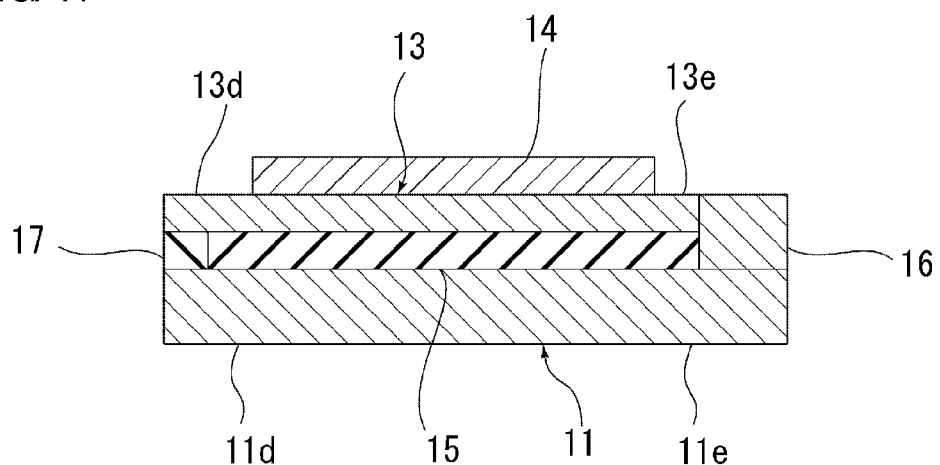
FIG. 11 is a schematic sectional view of a piezoelectric power generator according to a third modification.

FIG. 11 is a schematic sectional view of a piezoelectric power generator according to a third modification.

The third modification is a modification of the second embodiment. In the second embodiment, an example was described in which the connection portion 17 is formed in an integrated manner from the same material as the first and second elastic bodies 11 and 13. However, the present invention is not limited to this configuration.

For example, as illustrated in FIG. 11, the connection portion 17 may be provided as a separate body formed of a different material to the first and second elastic bodies 11 and 13. In this case, the connection portion 17 is preferably formed of a vibration suppressing member that suppresses transmission of vibration of the first elastic body 11 to the second elastic body 13, similarly to the vibration suppressing member 15. In this case, vibration of the first elastic body 11 is not likely to be transmitted to the second elastic body 13 via the connection portion 17. Therefore, a tensile stress is less likely to be applied to the piezoelectric substrate 14a. As a result, more excellent durability can be realized.

In this embodiment, the connection portion 17 is formed as a separate body to the vibration suppressing member 15, but the connection portion 17 and the vibration suppressing member 15 may instead be formed in an integrated manner.

In addition, the abutting portion 16 need not be provided. That is, for example, a piezoelectric power generator may be formed of a plate-shaped first elastic body, a plate-shaped second elastic body, a piezoelectric element being provided on a surface thereof on the opposite side to the first elastic body, and a vibration suppressing member that is arranged between the first and second elastic bodies and joined to each of the first and second elastic bodies.

Fourth Modification

Figure 12:
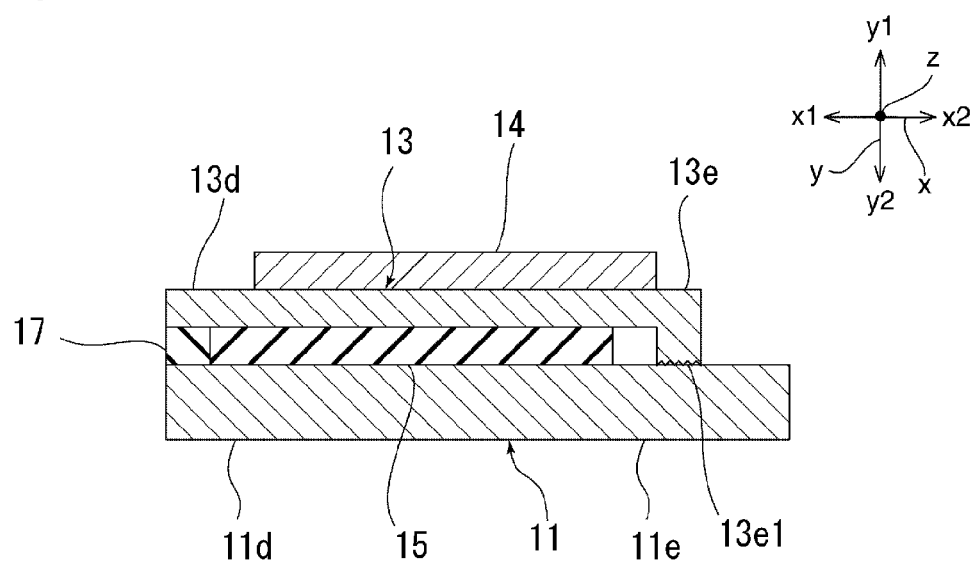
FIG. 12 is a schematic sectional view of a piezoelectric power generator according to a fourth modification.

FIG. 12 is a schematic sectional view of a piezoelectric power generator according to a fourth modification.

The fourth modification is a further modification of the third modification. As illustrated in FIG. 12, in this modification, instead of the abutting portion 16 being provided, an end surface 13e1 of the end portion 13e of the second elastic body 13, the end surface 13e1 being in contact with the first elastic body 11, is formed as a roughened surface. Also in this case, when the first elastic body 11 takes a shape that is concave toward the y1 side in the second direction y, the second elastic body 13 also takes a shape that is concave toward the y1 side in the second direction due to a frictional force generated between the end surface 13e1 and the surface of the first elastic body 11. Therefore, power generation is suitably performed.

In addition, similarly to as in the case of the third modification, since it is unlikely that tensile stress will be applied to the piezoelectric substrate 14a, excellent durability can be realized.

Third Embodiment

Figure 13:
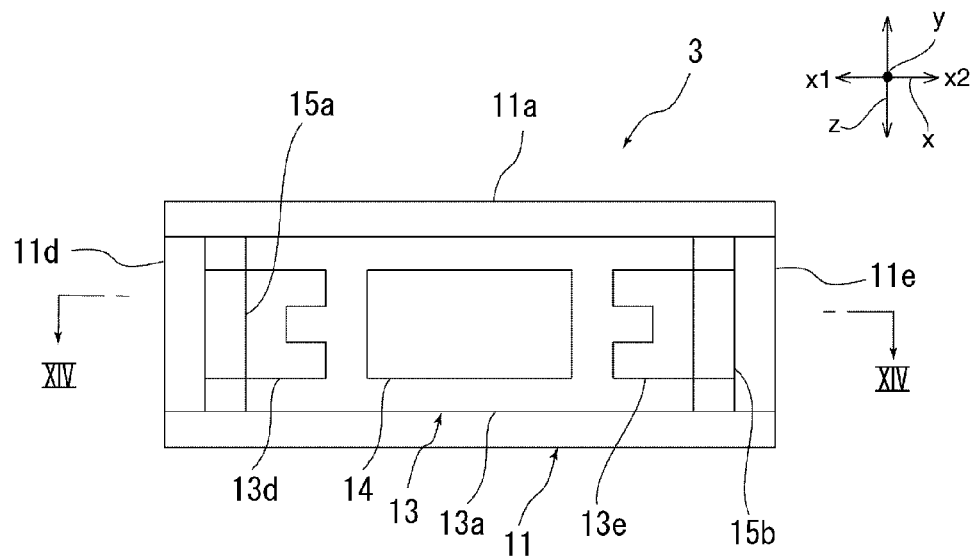
FIG. 13 is a schematic plan view of a piezoelectric power generator according to a third embodiment.
Figure 14:
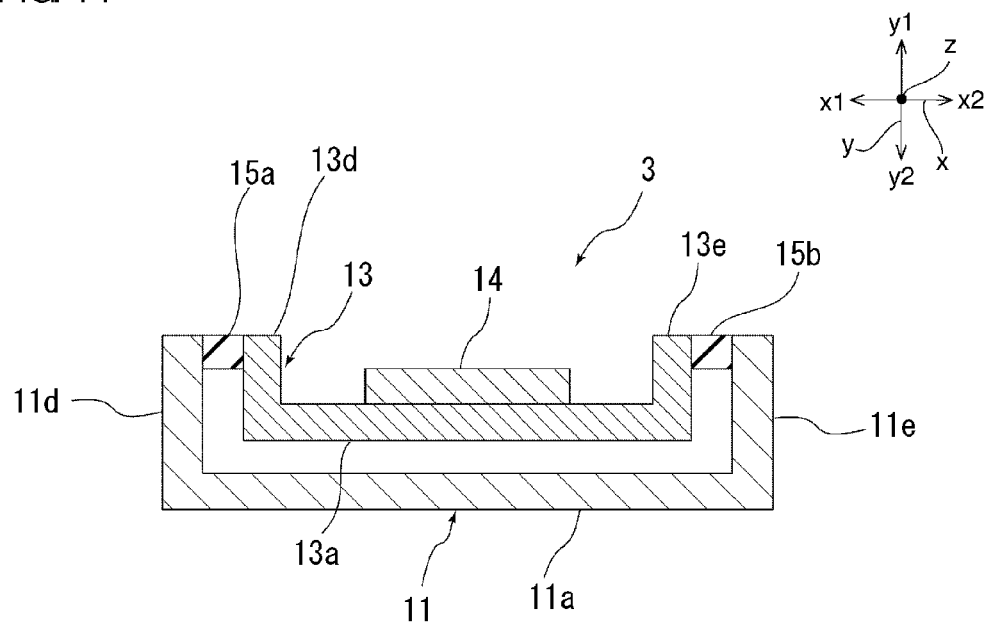
FIG. 14 is a schematic sectional view taken along line XIV-XIV in FIG. 13.

FIG. 13 is a schematic plan view of a piezoelectric power generator according to a third embodiment. FIG. 14 is a schematic sectional view taken along line XIV-XIV in FIG. 13.

In the first and second embodiments, examples were described in which the vibration suppressing member 15 is arranged between the first elastic body 11 and the second elastic body 13 in the second direction y. However, the present invention is not limited to this configuration.

As illustrated in FIG. 13 and FIG. 14, in a piezoelectric power generator 3 of this embodiment, the space between the first elastic body 11 and the second elastic body 13 in the second direction y is hollow. The end portions 13d and 13e of the second elastic body 13 are connected to the end portions 11d and 11e of the first elastic body 11 via first and second vibration suppressing members 15a and 15b, serving as first and second connection members. Also in this case, transmission of vibration of the first elastic body 11 to the second elastic body 13 is suppressed by the first and second vibration suppressing members 15a and 15b. Therefore, similarly to as in the first and second embodiments, excellent durability can be realized.

In this embodiment, the second elastic body 13 abuts against the end portions 11d and 11e of the first elastic body 11 via the first and second vibration suppressing members 15a and 15b and does not directly abut against the end portions 11d and 11e of the first elastic body 11. However, the present invention is not limited to this configuration. For example, along with the second elastic body 13 and the first elastic body 11 being connected to each other via the first and second vibration suppressing members 15a and 15b, a portion of the second elastic body 13 may abut against a portion of the first elastic body 11.

Fourth Embodiment

Figure 15:
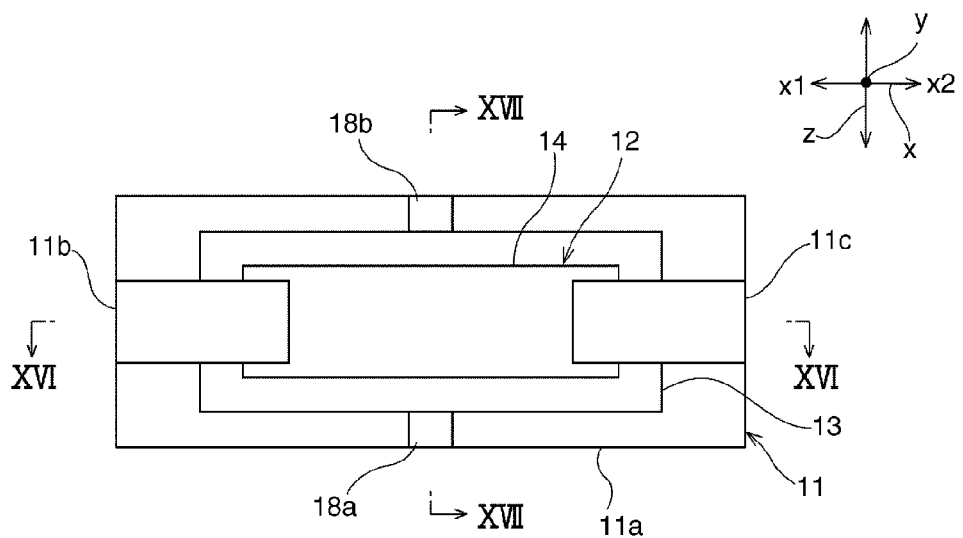
FIG. 15 is a schematic plan view of a piezoelectric power generator according to a fourth embodiment.
Figure 16:
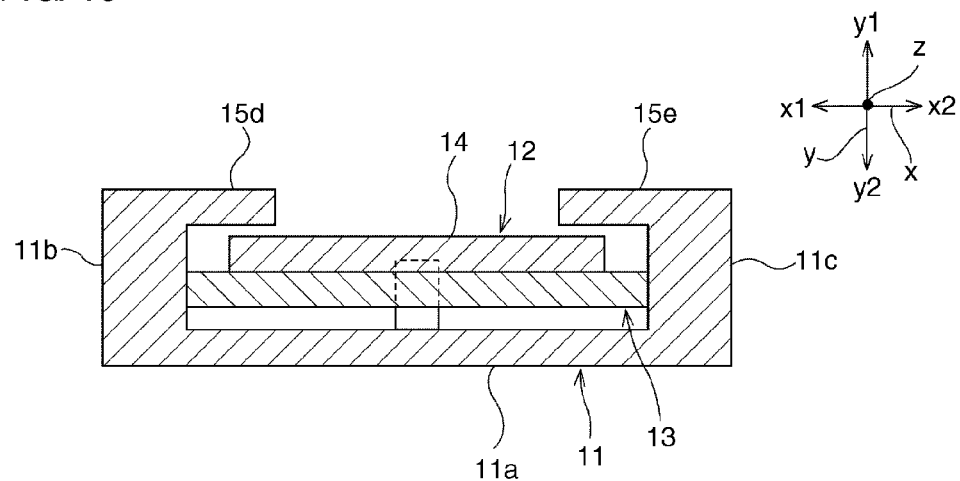
FIG. 16 is a schematic sectional view taken along line XVI-XVI in FIG. 15.
Figure 17:
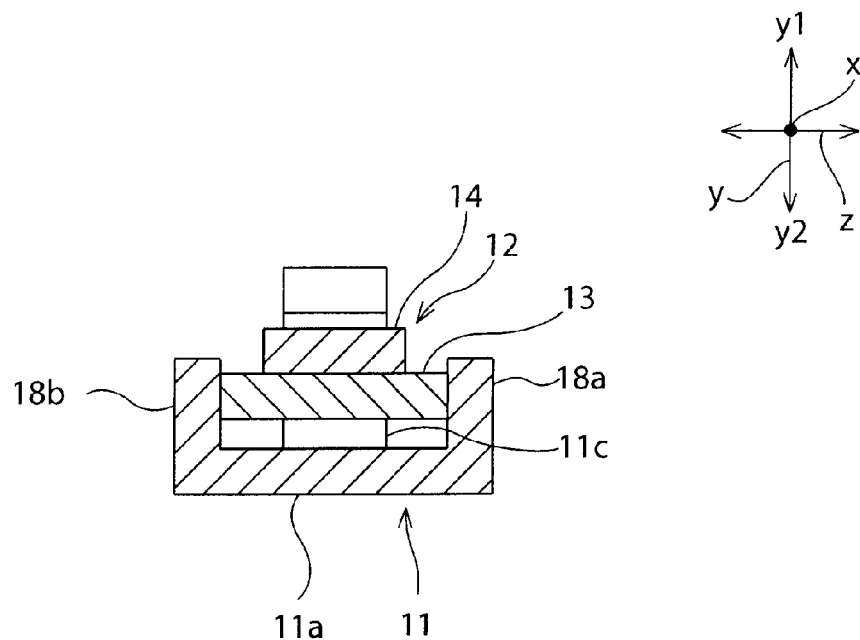
FIG. 17 is a schematic sectional view taken along line XVII-XVII in FIG. 15.
Figure 18:
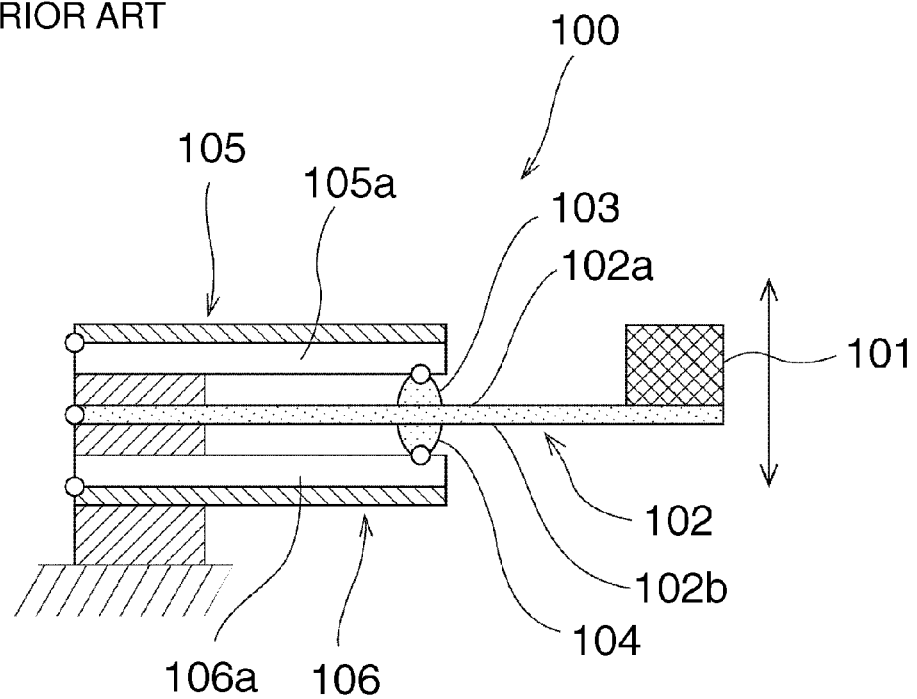
FIG. 18 is a schematic sectional view of a piezoelectric power generator described in Patent Document 1.

FIG. 15 is a schematic plan view of a piezoelectric power generator according to a fourth embodiment. FIG. 16 is a schematic sectional view taken along line XVI-XVI in FIG. 15. FIG. 17 is a schematic sectional view taken along line XVII-XVII in FIG. 15.

This embodiment is characterized by vibration suppressing members being formed by stoppers 15d and 15e that are fixed to the first elastic body 11 and abut against parts of the second elastic body 13 on the y1 side in the second direction y. The stoppers 15d and 15e, which serve as vibration suppressing members, are positioned on the y1 side with respect to both end portions in the x direction of the piezoelectric power-generating element 12. The piezoelectric power-generating element 12 is not fixed to the first elastic body 11, the vibration suppressing members or the abutting portions. Consequently, it is not likely that bending vibration will be transmitted to the piezoelectric power-generating element 12. In addition, when the second elastic body 13 attempts to undergo large bending vibration, the bending vibration is impeded by the stoppers 15d and 15e. Consequently, also in this embodiment, bending mode vibration of the second elastic body 13 is effectively attenuated.

In addition, since the stoppers 15d and 15e are provided, detachment of the piezoelectric power-generating element 12 can be also effectively prevented.

In addition, in this embodiment, since guides 18a and 18b are provided on both sides of the piezoelectric power-generating element 12 in the z direction, tilting of the piezoelectric power-generating element 12 with respect to the first elastic body 11 is suppressed.

REFERENCE SIGNS LIST 1-3 . . . piezoelectric power generator
10 . . . tire
10a . . . inner wall of tire
11 . . . first elastic body
11a . . . elastic body main body
11b . . . first abutting portion
11c . . . second abutting portion
11d, 11e . . . end portion
12 . . . piezoelectric power-generating element
13 . . . second elastic body
13a . . . elastic body main body
13b . . . first abutting portion
13c . . . second abutting portion
13d, 13e . . . end portion
13e1 . . . end surface
14 . . . piezoelectric element
14a . . . piezoelectric substrate
14b . . . first electrode
14c . . . second electrode
15, 15a to 15c . . . vibration suppressing member
15d, 15e . . . stopper
16 . . . abutting portion
17 . . . connection portion
18a, 18b . . . guide

The invention claimed is:

1. A piezoelectric power generator comprising:
a first elastic body configured to deform upon receiving a stress, the first elastic body including:
an elastic body main portion,
a first abutting portion that is fixed to the elastic body main portion and is positioned adjacent a first side of the second elastic body, and
a second abutting portion that is fixed to the elastic body main portion and is positioned adjacent a second side of the second elastic body, where the first side of the second elastic body is opposite the second side of the elastic main body;
a piezoelectric power-generating element that includes a second elastic body arranged adjacent a first side of the first elastic body; and
a vibration suppressing member arranged relative to the first elastic body and the second elastic body so as to suppress a bending mode vibration of the second elastic body,
wherein the piezoelectric power generator is structured such that, when the first elastic body deforms into a shape that is concave relative to the first side of the first elastic body, the second elastic body receives a stress from the first elastic body and deforms into a concave shape, and when the first elastic body deforms into a shape that is convex relative to the first side of the first elastic body, the second elastic body does not receive a stress from the first elastic body, and
wherein the first and second abutting portions abut against the second elastic body when the first elastic body deforms into the shape that is concave relative to the first side of the first elastic body.

2. The piezoelectric power generator according to claim 1, wherein the vibration suppressing member is at least partially arranged between the first elastic body and the second elastic body.

3. The piezoelectric power generator according to claim 1, wherein the vibration suppressing member is a stopper that is fixed to the first elastic body and opposes at least a part of the second elastic body on a side thereof opposite to the first side of the first elastic body.

4. The piezoelectric power generator according to claim 1, wherein a Young's modulus of the vibration suppressing member is smaller than Young's moduli of the first and second elastic bodies.

5. The piezoelectric power generator according to claim 4, wherein a loss coefficient of the vibration suppressing member is larger than loss coefficients of the first and second elastic bodies.

6. The piezoelectric power generator according to claim 1, wherein a loss coefficient of the vibration suppressing member is larger than loss coefficients of the first and second elastic bodies.

7. The piezoelectric power generator according to claim 1, wherein the vibration suppressing member is a spring.

8. The piezoelectric power generator according to claim 1, wherein the vibration suppressing member is arranged over an entirety of a part in which the first elastic body and the second elastic body overlap each other.

9. The piezoelectric power generator according to claim 1, wherein the vibration suppressing member comprises a plurality of vibration suppressing members arranged between the first elastic body and the second elastic body.

10. The piezoelectric power generator according to claim 9, wherein the plurality of vibration suppressing members are arranged at constant intervals with respect to each other between the first elastic body and the second elastic body.

11. The piezoelectric power generator according to claim 1, wherein a least a portion of one side of the second elastic body is fixed to the first elastic body.

12. The piezoelectric power generator according to claim 11, further comprising:
a fixing member that connects the at least a portion of the one side of the second elastic body to the first elastic body,
wherein the fixing member is at least part of the vibration suppressing member.

13. The piezoelectric power generator according to claim 1,
wherein the piezoelectric power generator further comprises a first connection member that connects the first abutting portion and the second elastic body to each other, and
a second connection member that connects the second abutting portion and the second elastic body to each other,
wherein each of the first and second connection members are at least part of the vibration suppressing member.

14. The piezoelectric power generator according to claim 1, wherein the first elastic body and the second elastic body are joined to each other via the vibration suppressing member.

* * * * *